United States Patent [19]
Miyano

[11] Patent Number: 5,912,590
[45] Date of Patent: Jun. 15, 1999

[54] BROAD-BAND AMPLIFIER CIRCUIT AND HIGH-SPEED COMMUNICATION ELEMENT USING THE SAME

[75] Inventor: Naoki Miyano, Osaka, Japan

[73] Assignee: Sharp Kabushiki Kaisha, Osaka, Japan

[21] Appl. No.: 08/770,050

[22] Filed: Dec. 19, 1996

[30] Foreign Application Priority Data

Dec. 19, 1995 [JP] Japan ................................ 7-330512

[51] Int. Cl.⁶ ........................... H03F 3/191; H03F 3/08
[52] U.S. Cl. ...................... 330/302; 330/294; 330/308; 330/310
[58] Field of Search .................. 330/59, 110, 292, 330/294, 302, 307, 308, 306; 250/214 A

[56] References Cited

U.S. PATENT DOCUMENTS

| | | | |
|---|---|---|---|
| 4,371,847 | 2/1983 | Biard et al. | 330/307 |
| 4,567,446 | 1/1986 | Konishi | 330/308 |
| 4,878,254 | 10/1989 | Richardson | 330/308 X |
| 4,916,409 | 4/1990 | Tracy | 330/294 |
| 5,166,639 | 11/1992 | Green et al. | 330/306 X |

*Primary Examiner*—Steven J Mottola

[57] ABSTRACT

A broad-band amplifier circuit is furnished with a plurality of amplifiers with a coupling capacitor being interposed between every two adjacent amplifiers. Each coupling capacitor has a capacity large enough to prevent adverse effect of external noise. Accordingly, not only the passing of a signal having a low frequency is allowed, but also an element operable in a high frequency, such as a Schottky transistor, can be provided in each amplifier as a transistor. At least the transistor of the amplifier in the last stage is connected to a diode, so that the charges accumulated between its collector and base while the amplifier stays on are fed back and eliminated. Accordingly, the broad-band amplifier circuit can carry out a flat amplifying operation over a wide range from low to high frequency bands, and therefore, can be used for all the ASK method, IrDA1.0 method, and IrDA1.1 method. Consequently, not only the manufacturing cost, but also the size of the broad-band amplifier circuit can be reduced.

12 Claims, 8 Drawing Sheets

BROAD-BAND AMPLIFIER CIRCUIT AND HIGH-SPEED COMMUNICATION ELEMENT USING THE SAME

FIELD OF THE INVENTION

The present invention relates to a broad-band amplifier circuit serving as a preferable infrared communication element used for mutual data transmission between computers, or between the computers and a peripheral device, such as a printer, or a portable terminal, and to a high-speed communication element using the same.

BACKGROUND OF THE INVENTION

Figure 7A:
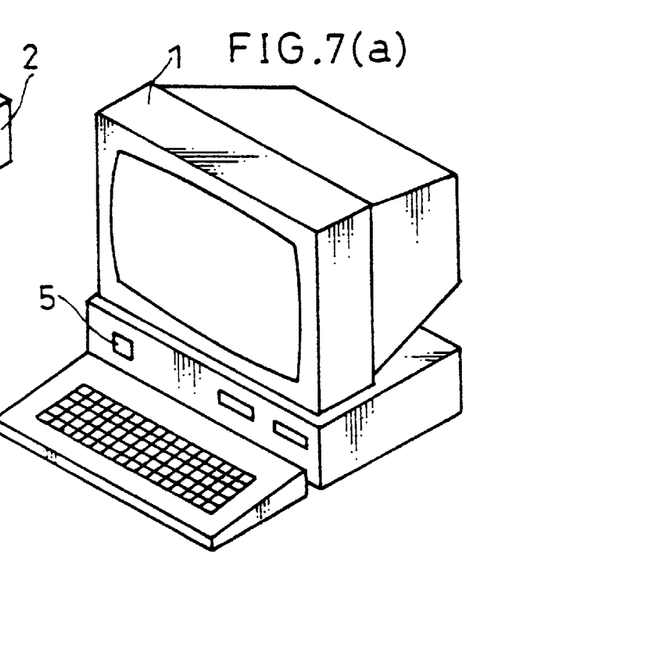
FIGS. 7(a) through 7(d) are perspective views of devices using infrared data communication.
Figure 7B:
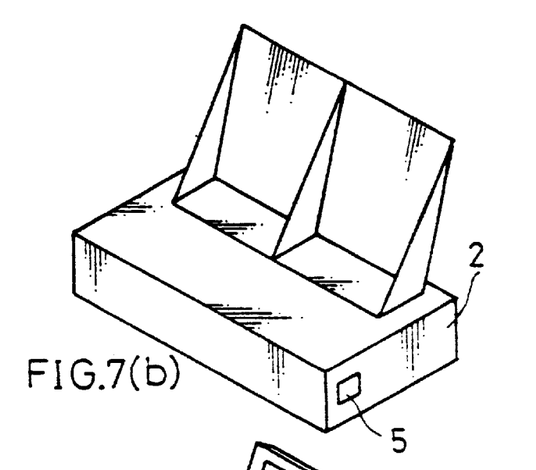
Figure 7C:
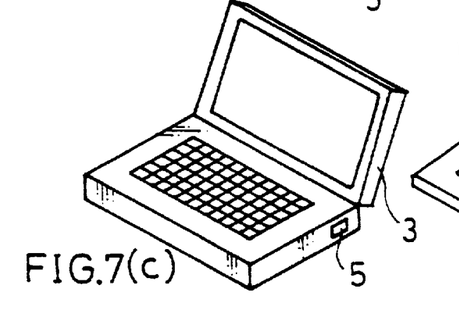
Figure 7D:
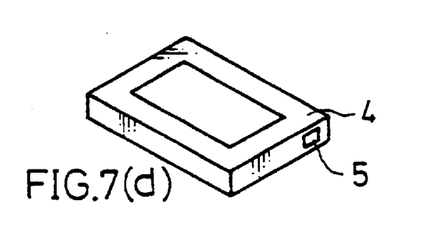

It has become popular to transmit data through infrared rays among a personal computer 1 of FIG. 7(a), another unillustrated personal computer, a printer 2 of FIG. 7(b) serving as a peripheral device, a notebook personal computer 3 of FIG. 7(c), a portable terminal 4 of FIG. 7(d) referred to as a PDA (Personal Digital Assistant), etc. Thus, each of the above devices includes a communication element 5 composed of a photodetector (photo-receiving/light-emitting) element, a circuit driving the photodetector element, etc. The communication element 5 is provided to each device in such a manner that its photodetecting surface positions at the device's side surface. This arrangement realizes concurrent, multiple transmission while omitting time-consuming cable connecting job.

Today, the IrDA (Infrared Data Association) adopts three standard communication methods specified below as a standard method for the infrared data communication.

① ASK (Amplitude Shift Keying) Method

Figure 8A:
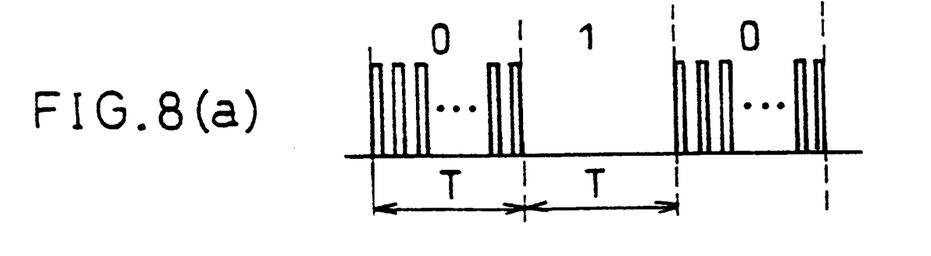
FIGS. 8(a) through 8(d) are waveforms explaining communication methods of infrared data communication.

In this communication method, the modulation technique adopted by a remote controller of some kinds of electronic devices is sped up. To be more specific, as shown in FIG. 8(a), a sub-carrier wave is modulated by a certain amplitude when the transmission data exhibit "0" and by a modulation factor of 0 (zero) when the transmission data exhibit "1" per cycle period T. The sub-carrier wave has a frequency of 500 kHz and a data transmission rate of 2.4–57.6 kbps. The infrared signals can be transmitted over distances of up to 300 cm.

Using the sub-carrier wave makes this communication method advantageous because satisfactory noise immunity can be attained by extracting the band of the sub-carrier wave using a bandpass filter at the receiver's end.

② IrDA1.0 Method

Figure 8B:
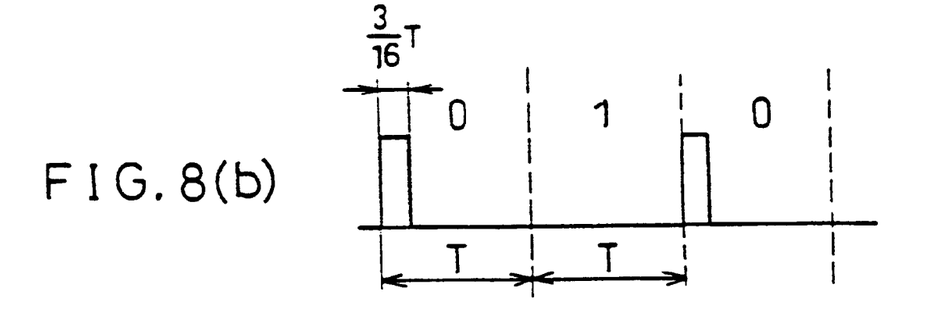

This communication method is based on a so-called SIR (Serial Infrared) method. As shown in FIG. 8(b), when the data exhibit "0" in a cycle period T, a pulse is outputted for a period of 3T/16 from the starting edge of the cycle period T. On the other hand, when the data exhibit "1", no pulse is outputted as is in the ASK method above. This communication method has a higher data transmission rate than the ASK method, for example, 2.4–115.2 kbps. The infrared signals can be transmitted over distances of up to 100 cm. Compared with the ASK method, the pulse is outputted for a shorter period per cycle period T. Thus, this communication method is advantageous in terms of saving power consumption.

③ IrDA1.1 (so-called FIR: Fast Infrared) Method

This communication method is a pulse position modulating method in which each cycle period T is divided into four segments and a pulse of T/4 wide is outputted in one segment out of these four segments to represent the data. More precisely, this communication method includes two techniques: one is a technique shown in FIG. 8(c) which has a relatively low data transmission rate of up to 1.152 Mbps; the other is a technique shown in FIG. 8(d) which has a relatively high data transmission rate of up to 4 Mbps. In both the techniques, infrared signals can be transmitted over distances of up to 100 cm.

Figure 8C:
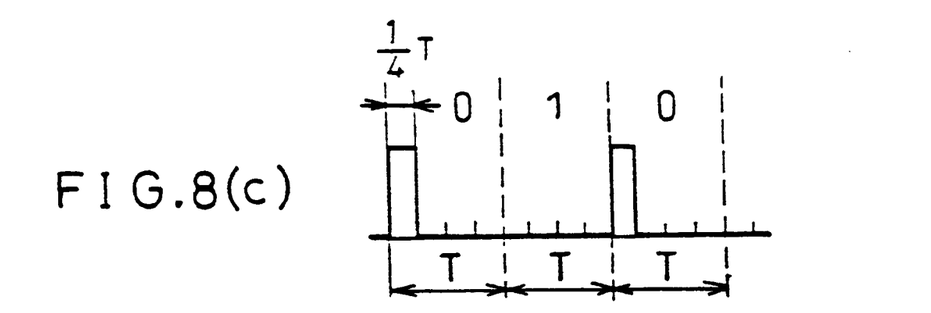

In the technique of FIG. 8(c), a pulse is outputted in the first of the four segments when the data exhibit "0", and no pulse is outputted when the data exhibit "1".

Figure 8D:
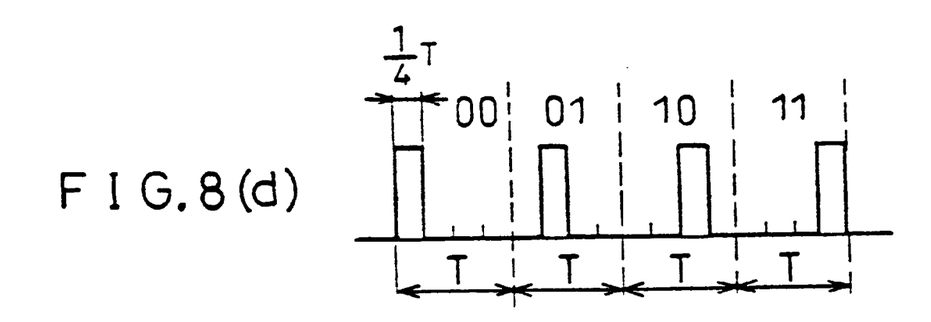

In the other technique of FIG. 8(d), in response to 2-bit data in a cycle period T, "00", "01", "10", and "11", a pulse is outputted at the first through fourth of the four segments in each cycle period, respectively. As can be understood from its data transmission rate, this technique is advantageous in that it can transmit a great volume of data, and hence, it can transmit color image data as well.

Figure 9:
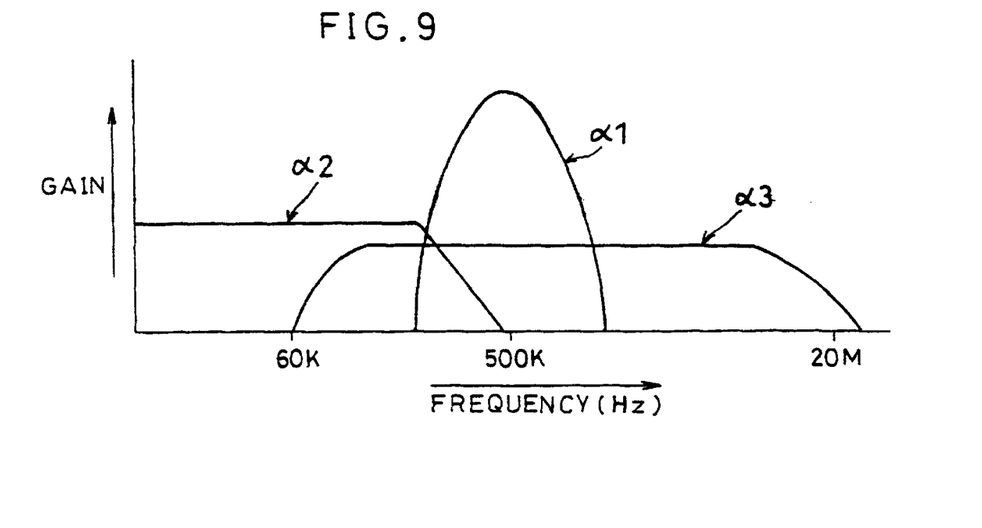
FIG. 9 is a graph showing a frequency spectrum of the communication methods of FIGS. 8(a) through 8(d)

The frequency spectrum of each transmission method is illustrated in FIG. 9. More specifically, in the ASK method, the frequency band width denoted as α1 covers a range of some hundreds kHz having its center sub-carrier frequency at 500 kHz. In the IrDA1.0 method, the frequency band width denoted as α2 covers a range of frequency from a low band to some hundreds kHz. In contrast, in the IrDA1.1 method, the frequency band width denoted as α3 covers a wide range of frequency between 60 kHz and 20 MHz.

Figure 10:
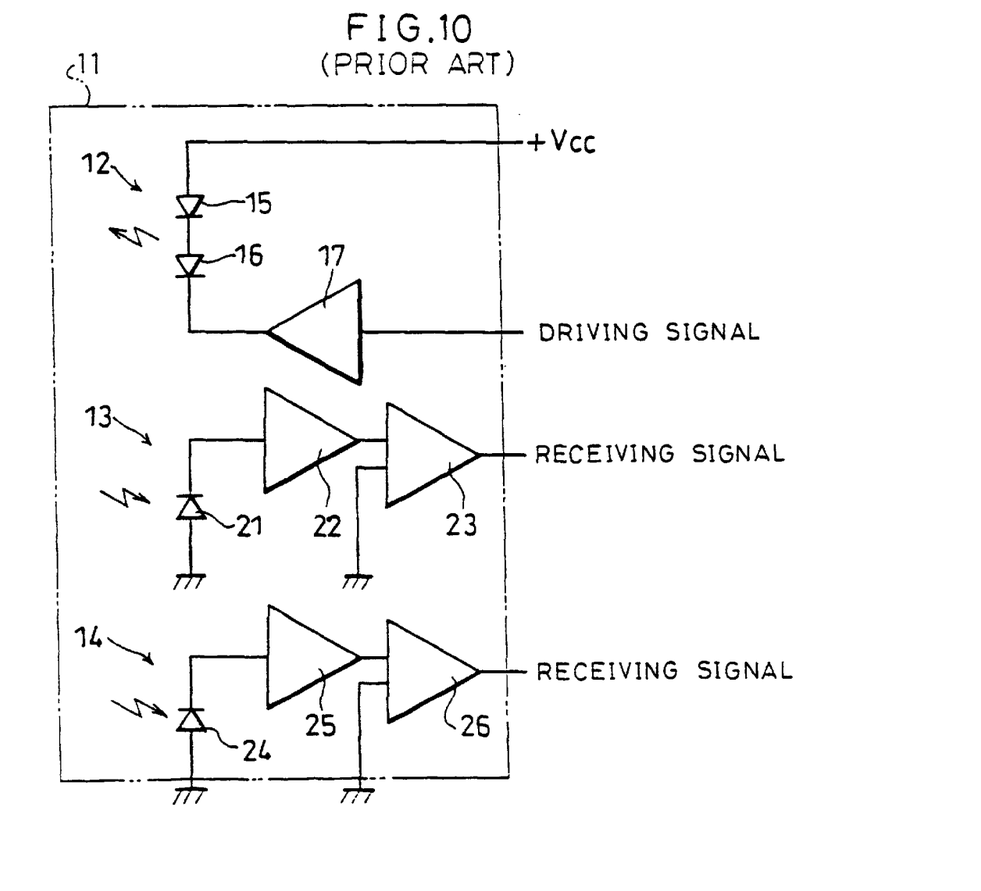
FIG. 10 is a circuit diagram showing a circuit arrangement of a typical conventional communication element.

Thus, as shown in FIG. 10, a typical conventional communication element 11 comprises a transmitting section 12 applicable for all the communication methods and two receiving sections 13 and 14. The transmitting section 12 comprises two light-emitting diodes 15 and 16 cascaded to each other and a driving circuit 17. The anode of the light-emitting diode 15 is connected to a high-level voltage +Vcc, while the cathode of the light-emitting diode 16 is connected to the output of the driving circuit 17. The input of the driving circuit 17 receives a driving signal of the light-emitting diodes 15 and 16 sent from an unillustrated modulation/demodulation section.

The receiving section 13 is used for both the ASK method and IrDA1.0 method, and comprises a photodiode 21, an amplifier 22, and a comparator 23. The photodiode 21 outputs a current corresponding to the photo-receiving level. The output current is converted into a voltage by the amplifier 22, and the same is also amplified and outputted to the comparator 23. The comparator 23 outputs a receiving signal to the modulation/demodulation section. The receiving signal shifts to the high level when the output from the amplifier 22 is equal to or higher than a predetermined level and shifts to the low level, otherwise.

In contrast, the receiving section 14 is a receiving device used for the IrDA1.1 method in a high frequency band. Like the receiving section 13, the receiving section 14 comprises a photodiode 24, an amplifier 25, and a comparator 26.

As has been explained, if the conventional communication element 11 is to be used for all the communication methods explained in FIGS. 8(a) through 8(d), the communication element 11 has to include at least two types of receiving devices: the receiving section 13 used for the ASK method or IrDA1.0 method in a relatively low frequency band; the receiving section 14 used for the IrDA1.1 method in a relatively high frequency band. This arrangement poses a problem that the manufacturing cost is increased and the communication element 11 can not be downsized.

Thus, using the conventional communication element 11 as the communication element 5 is disadvantageous in terms of further downsizing, particularly, the compact devices, such as the notebook personal computer 3 and portable terminal 4.

SUMMARY OF THE INVENTION

It is therefore an object of the present invention to provide a downsized, inexpensive broad-band amplifier circuit, and a high-speed communication element using such a broad-band amplifier circuit.

The above object is fulfilled by a broad-band amplifier circuit furnished with:

multi-stage amplifiers, each amplifier including a transistor, the transistor having a feedback capacitor for allowing passing of high frequency components; and at least one coupling capacitor, the coupling capacitor being interposed between every two adjacent amplifiers, the coupling capacitor having a capacity for allowing passing of a signal of tens of kHz or higher.

According to the above arrangement, the coupling capacitor is provided with the capacity allowing the passing of a signal of tens of kHz or higher. Thus, the broad-band amplifier circuit of the present invention can amplify a signal of a relatively low frequencies, which is generally used for data communication. Also, since the coupling capacitor allows the passing of a signal in a frequency band of tens of kHz or higher, adverse effects of external noise caused by, for example, a fluorescent light, can be suppressed. In addition, since the transistor in each amplifier is provided with the capacitor allowing the passing of high frequency components, the broad-band amplifier circuit of the present invention can amplify a signal of high frequencies as well.

Thus, the broad-band amplifier circuit of the present invention can amplify a signal over a wide range of frequency from a low frequency band to a high frequency band with a flat frequency response. Consequently, the broad-band amplifier circuit of the present invention can be used for all the known communication methods, and can be reduced in costs and size at the same time.

It is preferable that the above broad-band amplifier circuit is arranged in such a manner that:

the capacity of the coupling capacitor allows passing of a signal of 60 kHz or higher; and the feedback capacity of the transistor allows passing of a signal of 20 MHz or lower.

Arranged in this manner, the broad-band amplifier circuit of the present invention can be used for the infrared communication methods including the ASK method, IrDA1.0 method, and IrDA1.1 method. Therefore, it has become possible to provide a practical broad-band amplifier circuit which is suitably used for a typical infrared communication method.

It is further preferable that the above broad-band amplifier circuit is arranged to be further furnished with a diode for eliminating charges, accumulated between a collector and a base of the transistor while the transistor stays on, by feeding back the accumulated charges, the diode being provided at least to the amplifier in a last stage.

According to the above arrangement, the diode is provided at least to the amplifier in the last stage, so that the charges accumulated between its collector and base while the transistor stays on are fed back when the transistor goes off. In short, the accumulated charges are consumed by the diode and eliminated. This enables the transistor to operate at high speeds, thereby realizing a highly reliable broad-band amplifier circuit.

The above object is also fulfilled by a high-speed communication element furnished with:

a receiving section for receiving a sending signal; and a broad-band amplifier circuit for amplifying a receiving signal outputted from the receiving section, wherein, the broad-band amplifier circuit includes:

multi-stage amplifiers, each of the amplifier including a transistor, the transistor having a feedback capacity for allowing passing of high frequency components; and at least one coupling capacitor having a capacity for allowing passing of a signal of at least tens of kHz, the coupling capacitor being interposed between every two adjacent amplifiers.

According to the above arrangement, the broad-band amplifier circuit of the present invention can also amplify a signal over a wide range of frequency from a low frequency band to a high frequency band with a flat frequency response. Thus, it has become possible to provide an inexpensive, compact, high-speed communication element which can be used for all the known communication methods.

It is preferable that the above high-speed communication element is arranged in such a manner that:

the capacity of the coupling capacitor in the broad-band amplifier circuit allows passing of a signal of 60 kHz or higher; and the feedback capacity of the transistor in the broad-band amplifier circuit allows passing of a signal of 20 MHz or lower.

Arranged in this manner, the high-speed communication element of the present invention can be used for the infrared communication methods including the ASK method, IrDA1.0 method, and IrDA1.1 method. Therefore, it has become possible to provide a practical high-speed communication element which is suitably used for a typical infrared communication method.

It is further preferable to arrange the above high-speed communication element to be further furnished with:

a light-emitting element for emitting the above infrared rays; and a driving circuit for driving the light-emitting element, wherein, the driving circuit and broad-band amplifier circuit are integrated into a single chip to form an integrated circuit, the integrated circuit being mounted on a flexible print substrate in the form of a bare chip together with the light-emitting element and photo-receiving element.

According to the above arrangement, the integrated circuit is mounted on the flexible print substrate through bonding or the like together with the ligh-temitting element and photo-receiving element. Components, such as the integrated circuit, can be readily attached to the flexible print substrate, and the integrated circuit in the form of a bare chip can be downsized or installed in a device through an automatic assembly line. Thus, the high-speed communication element of the present invention can be readily mounted on a device at its marginal space by a minimum time-consuming manual job, such as soldering.

It is furthermore preferable to arrange the above high-speed communication element to be further furnished with a metal casing for covering the integrated circuit, the metal casing having an opening in a position opposing both a light-emitting surface of the light-emitting element and a photo-receiving surface of the photo-receiving element.

According to the above arrangement, the integrated circuit is covered with the metal casing. Thus, even when the high-speed transmission element of the present invention is installed in the hardware of a personal computer or peripheral devices, the high-speed transmission element is, in a reliable manner, shielded from noises caused by an output clock of the processor, or switching noise caused by a switching element of a power source circuit. In addition, the high-speed transmission element is also shielded from external noise caused by, for example, a fluorescent light. Consequently, since the high-speed transmission element of the present invention does not allow the entry of any noise, a signal can be transmitted (communicated) over a longer distance.

For a fuller understanding of the nature and advantages of the invention, reference should be made to the ensuing detailed description taken in conjunction with the accompanying drawings.

DESCRIPTION OF THE EMBODIMENTS

Referring to FIGS. 1 through 6, the following description will describe an example embodiment of the present invention.

Figure 1:
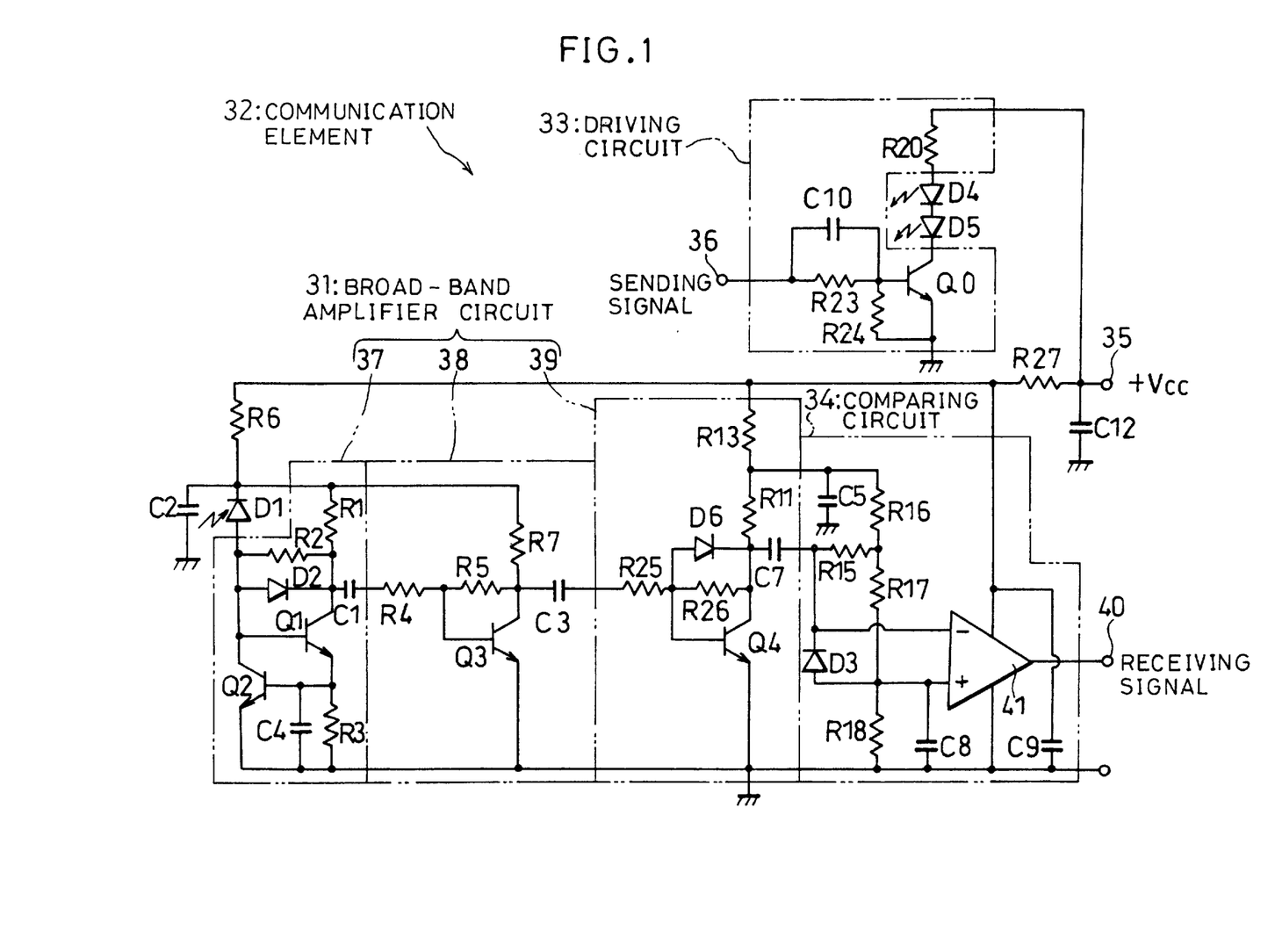
FIG. 1 is an electric circuit diagram of a communication element using a broad-band amplifier circuit in accordance with an example embodiment of the present invention.

FIG. 1 is an electric circuit diagram showing a communication element 32 using a broad-band amplifier circuit 31 in accordance with the present embodiment.

The communication element 32 mainly comprises a pair of light-emitting diodes D4 and D5 which are in effect light-emitting elements connected in series, a driving circuit 33 for driving the light-emitting diodes D4 and D5, a photodiode D1 serving as a photo-receiving element, the broad-band amplifier circuit 31, and a comparing circuit 34.

The driving circuit 33 comprises a transistor Q0, three resistors R20, R23, and R24, and a capacitor C10. An input high-level voltage +Vcc from a power source input terminal 35 is smoothed by a smoothing capacitor C12, and further supplied to the anode of the light-emitting diode D4 through the current limiting resistor R20. The cathode of the light-emitting diode D4 is connected to the anode of the other light-emitting diode D5. The cathode of the light-emitting diode D5 is connected to the collector of the transistor Q0. On the other hand, a sending signal entering from an input terminal 36 is divided by the resistors R23 and R24 and inputted into the base of the transistor Q0. The emitter of the transistor Q0 is grounded, and the capacitor C10 for bypassing a high-frequency is provided in parallel to the resistor 23.

Arranged in this manner, the light-emitting diodes D4 and D5 respectively output an infrared pulse having an amplitude determined by a current limited by the current limiting resistor R20 and corresponding to the above sending signal.

The cathode of the photodiode D1 is impressed with the voltage +Vcc through resistors R27 and R6 and a smoothing capacitor C2. The output current from the photodiode D1 is converted into a voltage by a current-to-voltage converting circuit 37 serving as a pre-amplifier, and inputted into the comparing circuit 34 through amplifiers 38 and 39, which altogether serve as a 2-stage power amplifier. The comparator circuit 34 compares the output voltage from the amplifier 39 with a predetermined threshold level to shape a rectangular pulse, which is outputted as a receiving signal from an output terminal 40.

The current-to-voltage converting circuit 37 comprises a pair of transistors Q1 and Q2, three resistors R1, R2, and R3, a coupling capacitor C1, a capacitor C4, and a diode D2. An output current from the anode of the photodiode D1 is supplied to the base of the transistor Q1 and the same is also inputted into the collector of the transistor Q2. The output voltage from the smoothing capacitor C2 is impressed on the collector of the transistor Q1 through the resistor R1. The emitter of the transistor Q1 is grounded through a parallel circuit composed of the resistor R3 and capacitor C4, and the same is also connected to the base of the transistor Q2. The emitter of the transistor Q2 is also grounded. The bias resistor R2 and diode D2 are provided in parallel to each other between the base and collector of the transistor Q1, and detailed explanation of the diode D2 will be given below.

The transistor Q1 of the current-to-voltage converting circuit 37 starts to conduct when a current, produced by the photodiode D1 upon receipt of an infrared pulse, flows into its base. At the same time, the transistor Q2 also starts to conduct by a terminal voltage across the capacitor C4 and resistor R3 produced by an emitter current from the transistor Q1. The output current from the photodiode D1 flows into the collector of the transistor Q2, by which the voltage is produced across the resistor R1 and outputted to the amplifier 38 in the next stage through the coupling capacitor C1.

The amplifier 38 comprises a transistor Q3, a resistor R7, and two gain setting resistors R4 and R5. The output voltage from the current-to-voltage converting circuit 37, which enters through the coupling capacitor C1, is supplied to the base of the transistor Q3 through the resistor R4. The base and collector of the transistor Q3 are connected to each other through the resistor R5, and an output voltage from the capacitor C2 is impressed on the collector of the transistor Q3 through the resistor R7. Further, the emitter of the transistor Q3 is grounded.

For example, the resistance of the resistor R4 is 1 kΩ, and the resistance of the resistor R5 is 10 kΩ. Thus, it is understood that the output voltage from the current-to-voltage converting circuit 37 is amplified by approximately 10 times by the amplifier 38 before it is outputted. The output from the amplifier 38 is outputted to the amplifier 39 in the next stage through a coupling capacitor C3.

The amplifier 39 comprises a transistor Q4, four resistors R25, R26, R11, R13, and a photodiode D6 which will be explained below, and the first through fourth components correspond to the transistor Q3, and resistors R4, R5, and R7 of the amplifier 38, respectively. The output from the amplifier 38 is inputted into the base of the transistor Q4 through the resistor R25. The resistor R26 and diode D6 are provided in parallel to each other between the base and collector of the transistor Q4. The output voltage from the capacitor C12 is impressed on the collector of the transistor Q4 through the resistors R27, R11, and R13. The output of the amplifier 39 is outputted from the collector of the transistor Q4, and supplied to the comparing circuit 34 through a coupling capacitor C7.

For example, the resistance of the resistor R25 is 1 kΩ and the resistance of the resistor 26 is 22 kΩ. Thus, it is understood that the output from the amplifier 38 is amplified by approximately 22 times by the amplifier 39 before it is outputted.

The comparing circuit 34 comprises a comparator 41, a capacitor C9 for smoothing a power source voltage, three dividing resistors R16, R17, and R18 for producing a reference voltage, an input resistor R15, two capacitors C5 and C8, and a diode D3. An output from the amplifier 39 is inputted into an inverting input terminal of the comparator 41, and the same is also inputted into the other non-inverting input terminal through the input resistor R15 and dividing resistors R17 and R18. Also, the terminal voltage of the capacitor C12 inputted through the resistors R27 and R13 is divided by the resistors R16, R17, and R18 and inputted into the non-inverting input terminal of the comparator 41. Note that the capacitor C5 provided to stabilize the impressed voltage is connected in parallel to the series circuit composed of the resistors R16, R17, and R18. The capacitor C8 provided in parallel to the resistor R18 averages an output from the amplifier 39 to stabilize the reference voltage.

The comparator 41 outputs a high-level signal when the input level of the inverting input terminal becomes equal to or greater than the reference voltage inputted into the other non-inverting input terminal, and outputs a low-level signal otherwise. The output from the comparator 41 is outputted to the output terminal 40 as a receiving signal.

The communication element 32 arranged as above is used in the infrared data communication, and can be used for all the ASK method, IrDA1.0 method, and IrDA1.1 method.

Thus, a capacity of the coupling capacitor C1 can be computed using a relationship established between a gain A of the amplifier 38 serving as a high-pass filter and the capacity of the coupling capacitor C1. To be more specific, let the base diffused resistor of the transistor Q3 be rb (about 50 Ω), and the emitter's internal resistance be re (about 25.7/Ie[Ω] at room temperature, where Ie is an emitter current), then the gain A of the amplifier 38 can be computed by the following Equation:

$$A(f) \approx \{(R5+R7)\|hie\}/\{(½\pi fC1)+R4+(R5+R7)\|hie\} \quad (1)$$

where hie is an input impedance of the transistor Q3 and can be expressed as:

$$hie = rb + (1+hfe) \times re \quad (2)$$

where hfe is a current amplification factor of the transistor Q3. Also, $(R5+R7)\|hie$ can be re-written as:

$$(R5+R7)\|hie = 1/\{(1/hie)+1/(R5+R7)\}. \quad (3)$$

Herein, a low-band cut-off frequency fL is set to 60 kHz, so that the communication element 32 can be used for both the IrDA1.0 method and IrDA1.1 method and adverse effect of external noise caused by, for example, a fluorescent light, can be suppressed. Also, a capacity as large as 1.8 nF is given to the coupling capacitor C1 from Equation (1) above, thereby allowing the passing of components of having a frequency of 60 kHz or higher.

In addition, a large capacity is given to both the coupling capacitor C7 between the amplifier 39 and comparing circuit 34, and the coupling capacitor C3 between the amplifiers 38 and 39, so that the communication element 32 can be used for both the IrDA1.0 method and IrDA1.1 method while allowing the passing of the components having a frequency of 60 kHz or higher. For example, a capacity of a few μF is given to the former, and a capacity of 0.1 μF is given to the latter.

Figure 2A:
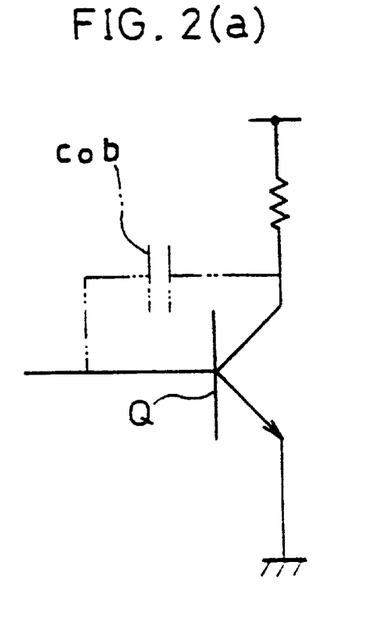
FIG. 2(a) is an equivalent circuit diagram when an amplifying transistor in the above broad-band amplifier circuit operates at high frequencies.
Figure 2B:
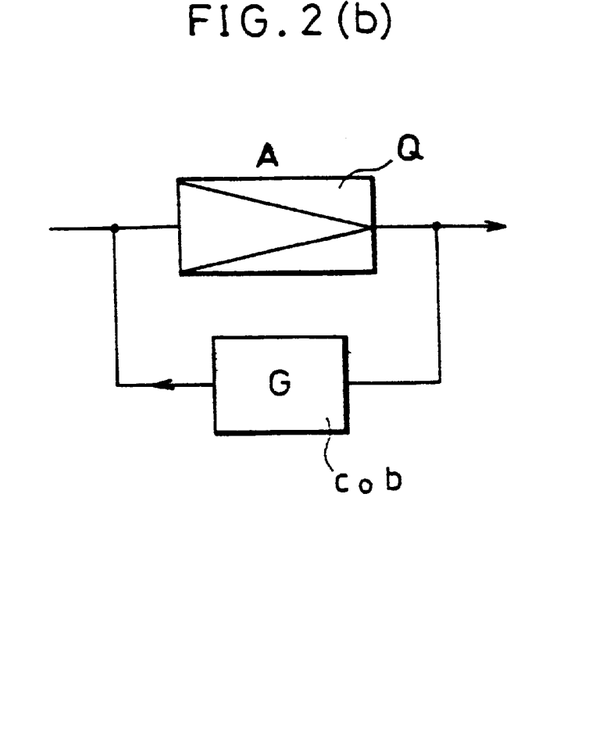
FIG. 2(b) is an equivalent block diagram when the amplifying transistor in the above broad-band amplifier circuit operates at high frequencies.

A Schottky transistor of FIG. 2(a) with a small feedback capacity Cob is used as the transistors Q1, Q2, Q3, and Q4 (which are referred to as transistor Q when the description applies to each) to accelerate the overall operation speed. As shown in FIG. 2(b), the transistor Q is assumed to comprise an amplifier circuit having a gain A, and a feedback circuit Cob having a gain G. Thus, when A>>1, then, A≈1/G, therefore, $$A = hie/\{½\pi fCob) + hie\}. \quad (4)$$

Equation (4) reveals that as the frequency f increases, the gain A approximates to 1, thereby enabling the transistors Q to operate as a low-pass filter.

For the above reason, reducing the feedback capacity Cob smaller allows the passing of the high frequency components. For example, in the present embodiment, Cob=0.8 pF, to have the high-band cut-off frequency fH of 20 MHz, so that the communication element 32 can be used for the IrDA1.1 method.

Figure 3:
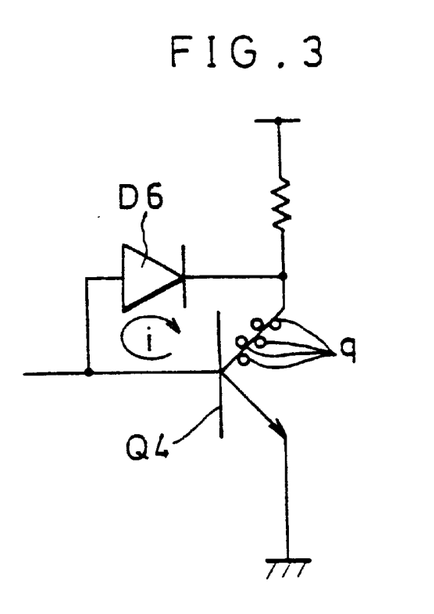
FIG. 3 is an electric circuit diagram illustrating an arrangement of a high-speed transistor.
Figure 4A:
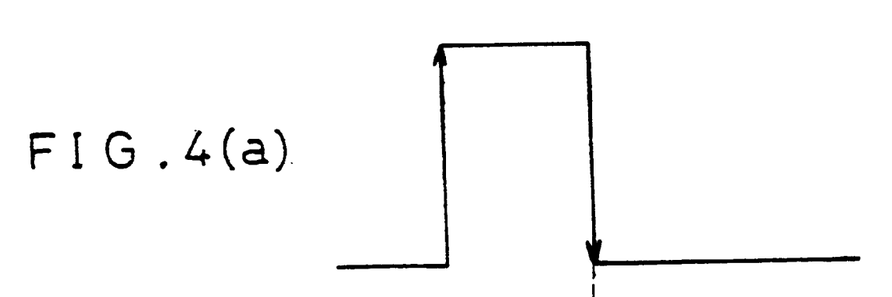
FIGS. 4(a) through 4(c) show waveforms explaining an operation of the transistor arranged as FIG. 3.
Figure 4B:
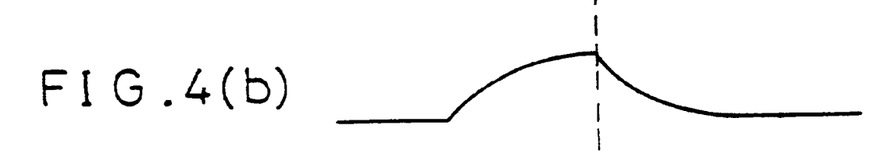
Figure 4C:
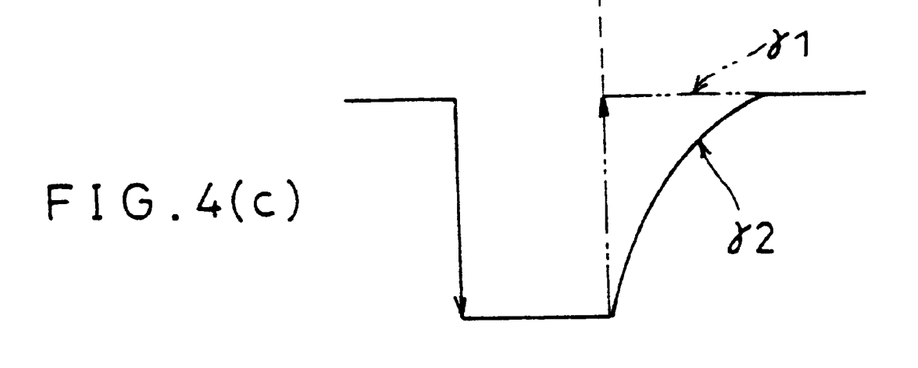

Further, in the present embodiment, the collector and base of at least the transistor Q4 in the last stage is connected through the diode D6. The transistor, including both a typical one and the transistor Q4, accumulates charges denoted by a small letter q between the collector and base while it stays on as is illustrated in FIG. 3. Thus, in response to a pulse of FIG. 4(a) supplied to the base, the base potential of the transistor varies moderately as shown in FIG. 4(b). For this reason, although the output from the collector should rise abruptly in response to the falling edge of the above pulse as denoted by γ1 in FIG. 4(c) in theory, it rises moderately as denoted by γ2 in practice. Thus, the output pulse does not respond sharply to an abrupt change in the input pulse, which makes a high-speed operation impossible.

To eliminate the above problem, the charges q accumulated while the transistor stays on are fed back to the diode D6 when the transistor goes off as illustrated by a small letter i in FIG. 3 so as to be consumed by the diode D6 and eliminated from the transistor. This arrangement enables the transistor Q4 to operate at high speeds. Also, in the circuit of FIG. 1, the diode D2 is provided to accompany with the transistor Q1 for the same purpose. Providing the diode of this kind to the amplifier (amplifier 39 in FIG. 1) in the last stage alone is sufficient to attain satisfactory effects. The diodes may be provided to the other amplifiers if the costs, occupied space, etc. allow.

Figure 5:
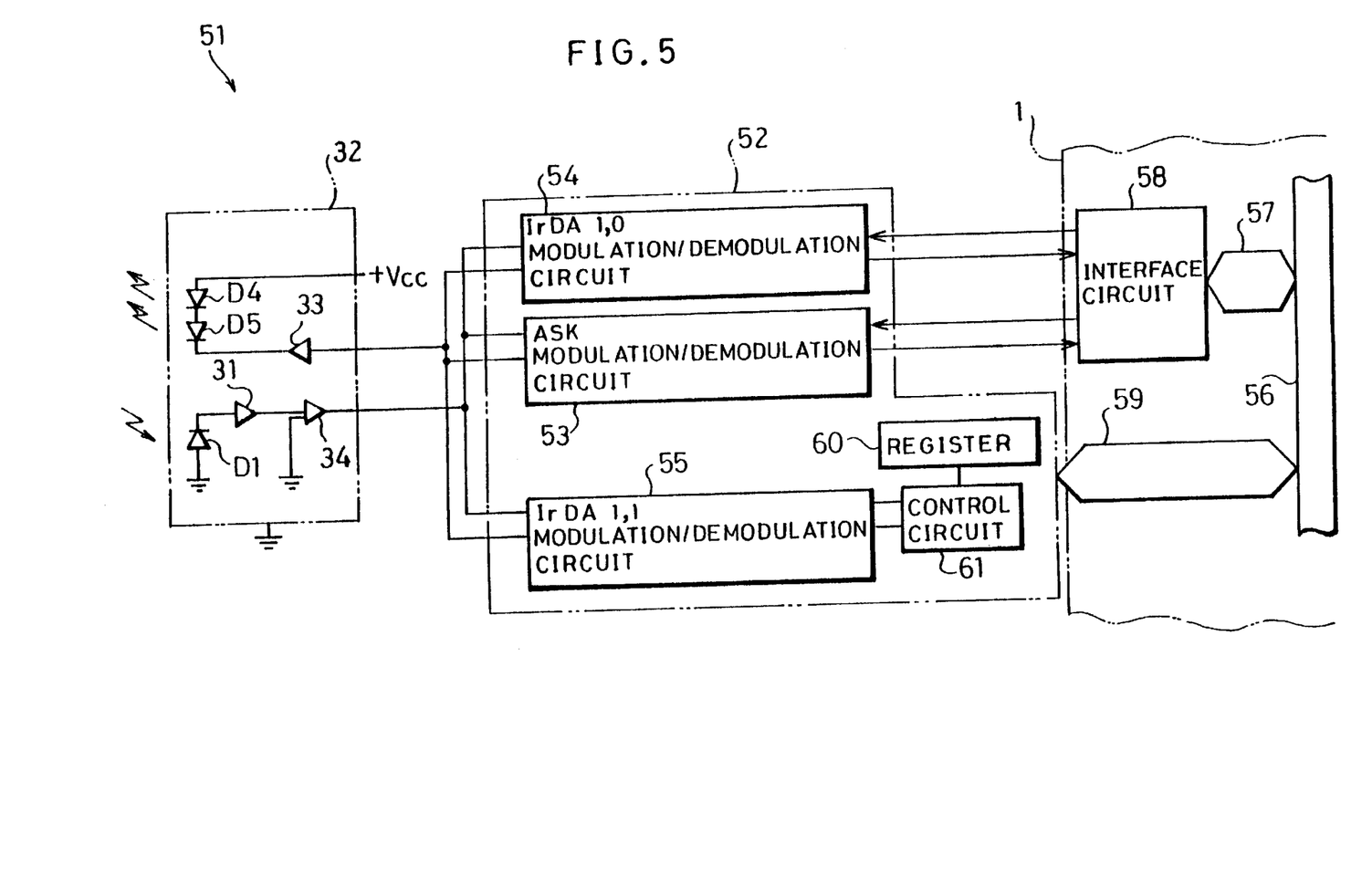
FIG. 5 is a block diagram showing an electrical arrangement of a communication device using the communication element of FIG. 1.

FIG. 5 is a block diagram showing an electrical arrangement of a transmission device 51 using the above-arranged communication element 32. In the drawing, like components are labeled with like reference numerals with respect to FIG. 1, and the description of these components is not repeated for the explanation's convenience.

As has been explained, the communication element 32 can be used for the ASK method, IrDA1.0 method, and IrDA1.1 method of FIGS. 8(a) through 8(d) by adopting the broad-band amplifier circuit 31. Thus, if the communication element 32 is installed in the personal computer 1 of FIG. 7(a), modulation/demodulation circuits 53–55 corresponding to the respective three communication methods are also installed in a data converting circuit 52 for converting and restoring the data transmitted between the personal computer 1 and communication element 32. The data converting circuit 52 is, in practice, a so-called ASIC (Application Specific Integrated Circuit) or the like.

Transmission data from the personal computer 1, outputted from a transferring register or the like, are inputted into an interface circuit 58 through buses 56 and 57, and subject to parallel-to-serial conversion. Then, the converted data are inputted into the modulation/demodulation circuits 53 and 54 of the data converting circuit 52. The transmission data are also inputted into a register 60 of the data converting circuit 52 through the buses 56 and 59. A control circuit 61 of the data converting circuit 52 selectively energizes one of the modulation/demodulation circuits 53–55 in response to a selection output informing the adopted communication method, which is inputted from the personal computer 1 through the buses 56 and 59.

Accordingly, when one of the ASK method and IrDA1.0 method is selected, the serial data inputted from the interface circuit 58 are modulated by the modulation/demodulation circuit 53 or 54 as shown in FIGS. 8(a) and 8(b), respectively. The communication element 32 drives the light-emitting diodes D4 and D5 by means of the driving circuit 33 based on the pulse thus modulated. On the other hand, if the IrDA1.1 method is selected, the transmission data transmitted through the buses 56 and 59 are stored into the register 60 first, and thence retrieved per cycle period T and modulated by the modulation/demodulation circuit 55 as shown in FIGS. 8(c) or 8(d). The pulse thus modulated is outputted to the driving circuit 33.

In contrast, the signal entering into the photodiode D1 is amplified by the broad-band amplifier circuit 31, discriminated in level by the comparing circuit 34, and supplied to each of the modulation/demodulation circuit 53–55. The control circuit 61 judges the adopted communication method based on the receiving signal, and selectively energizes one of the modulation/demodulation circuit 53–55 for the judged communication method to demodulate and output the received data. The output from the modulation/demodulation circuit 53 or 54 is subject to serial-to-parallel conversion by the interface circuit 58 first, and thence sent to the personal computer 1.

Figure 6:
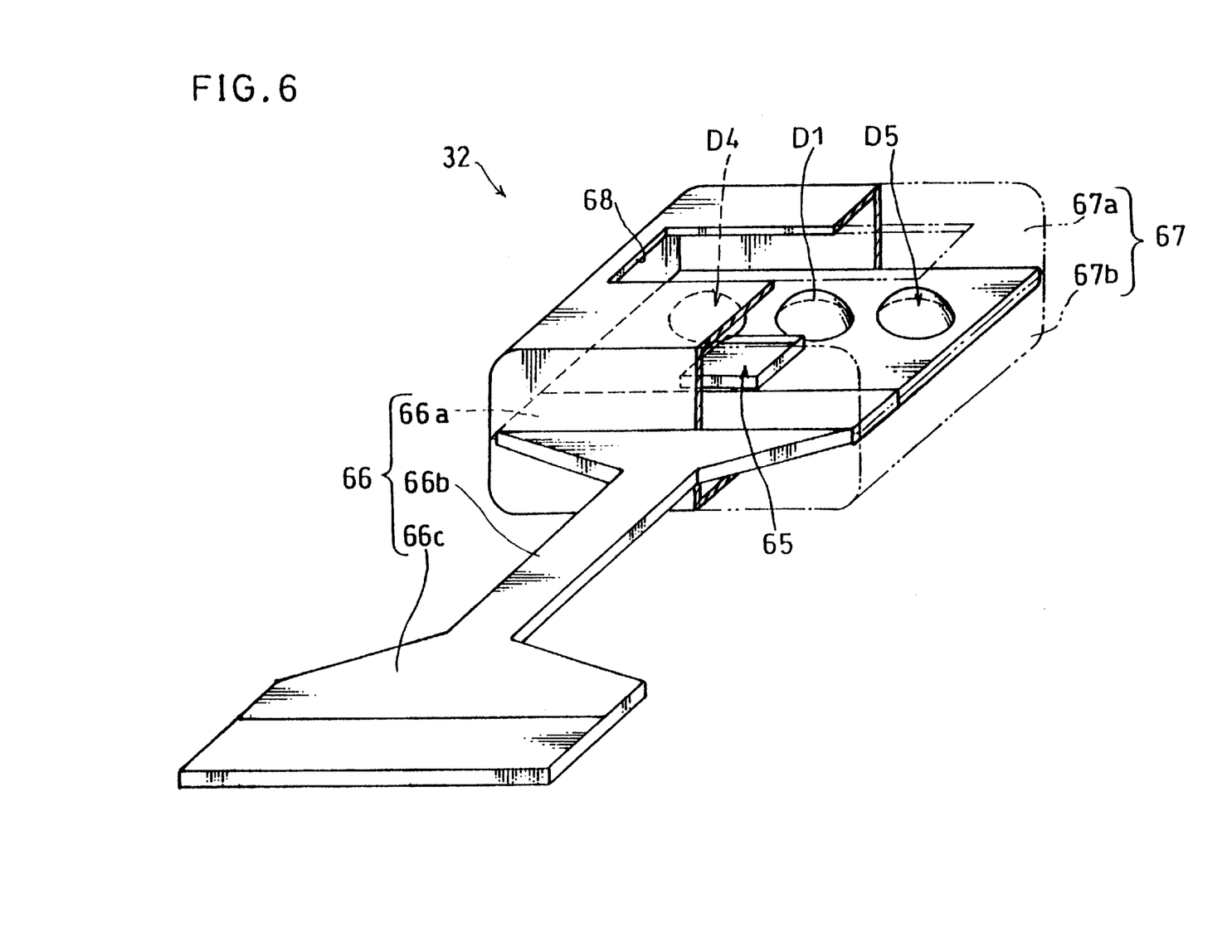
FIG. 6 is a perspective view depicting a structure of the above communication element.

FIG. 6 is a perspective view explaining the structure of the communication element 32. The broad-band amplifier circuit 31, driving circuit 33 and comparing circuit 34 are integrated into an integrated circuit 65 in the form of a bare chip. The integrated circuit 65 is mounted on a mounting section 66a of a flexible print substrate 66 through bonding to an unillustrated pattern. The light-emitting diodes D4, D5 and photodiode D1 are attached and soldered to the mounting section 66a through the reflow soldering after the integrated circuit 65 is bonded thereon.

The flexible print substrate 66 comprises the mounting section 66a, a linking section 66b, and a connecting section 66c. The connecting section 66c includes a number of connector terminals, which are electrically connected to corresponding terminals when inserted into a socket of the personal computer 1 or the like. The linking section 66b links the mounting section 66a and connecting section 66c, and although it is not illustrated, a number of wiring patterns are printed thereon. In the present embodiment, the linking section 66b has a narrow width to occupy less space when mounted.

Both the main and back surfaces of the mounting section 66a are covered with a metal casing 67 made of a pair of covering sections 67a and 67b assembled in a vertical direction. The covering section 67a facing the main surface of the mounting section 66a, on which the integrated circuit 65 and the like are mounted, has an opening 68 at a position opposing the light-emitting diodes D4 and D5 and photodiode D1. The coating sections 67a and 67b are soldered at the peripheral edges while enclosing the mounting section 66a. Providing the mounting section 66a inside the casing 67 having the opening 68 as above makes it possible to shield the circuits 31, 33, and 34 from the external noise while allowing the light-emitting diodes D4 and D5 to emit light and the photodiode D1 to receive light.

Consequently, it has become possible to prevent the entry of noise into the communication element 32 having the broad-band amplifier circuit 31 with a high gain, thereby extending the communication distance.

As has been explained, the communication element 32 of the present invention uses the broad-band amplifier circuit 31 having a flat frequency response over a wide frequency band ranging from 60 kHz to 20 MHz. Thus, the communication element 32 can be used for all the ASK method, IrDA1.0 method, and IrDA1.1 method of FIGS. 8(a) through 8(d). As a result, not only the costs, but also the occupied space of the transmission element 32 can be saved. The broad-band amplifier circuit 31 is particularly suitable for downsized devices, such as the notebook personal computer 3 and portable terminal 4 of FIGS. 7(c) and 7(d), respectively.

In the communication element 32, the broad-band amplifier circuit 31, driving circuit 33, and comparing circuit 34, which are peripheral circuits for the light-emitting diodes D4 and D5 and photodiode D1, are integrated into the single-chip integrated circuit 65. Further, the integrated circuit 65 is mounted, on the flexible print substrate 66 in the form of a bare chip. This arrangement can reduce the time-consuming manual job, such as soldering, and makes it easy to install the communication element 32 in the notebook personal computer 3 or portable terminal 4 at the marginal space.

In addition, since the mounting section 66a is covered with the casing 67, each circuit contained in the integrated circuit 65 can operate in a stable manner despite of noise caused by the clock in the processing circuits or switching noise of the switching element of the power source circuit of the notebook personal computer 3 or portable terminal 4, and external noise caused by, for example, fluorescent light.

Note that the use of the broad-band amplifier circuit 31 of the present invention is not limited to the infrared communication, and the broad-band amplifier circuit 31 can be suitably used for other purposes. In addition, the infrared communication may use wires made of photoconductive material, such as optical fibers.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A broad-band amplifier circuit comprising:
   multi-stage amplifiers, said each amplifier including a transistor, said transistor having a feedback capacitor for allowing passing of high frequency components;
   at least one coupling capacitor, said coupling capacitor being interposed between every two adjacent amplifiers, said coupling capacitor having a capacity for allowing passing of a signal of tens of kHz or higher; and a diode for eliminating charges, accumulated between a collector and a base of said transistor while said transistor stays on, by feeding back said accumulated charges, said diode being provided at least to an amplifier in a last stage.

2. The broad-band amplifier circuit as defined in claim 1, wherein:

the capacity of said coupling capacitor allows passing of a signal of 60 kHz or higher; and the feedback capacity of said transistor allows passing of a signal of 20 MHz or lower.

3. The broad-band amplifier circuit as defined in claim 1, wherein said transistor is a Schottky transistor.

4. A high-speed communicating element comprising:

a receiving section for receiving a sending signal; and a broad-band amplifier circuit for amplifying a receiving signal outputted from said receiving section, wherein, said broad-band amplifier circuit includes multi-stage amplifiers, each of said amplifiers including a transistor, said transistor having a feedback capacity for allowing passing of high frequency components, at least one coupling capacitor having a capacity for allowing passing of a signal of at least tens of kHz, said coupling capacitor being interposed between every two adjacent amplifiers, and a diode for eliminating charges, accumulated between a collector and a base of said transistor while said transistor stays on, by feeding back said accumulated charges, said diode being provided at least to an amplifier in a last stage.

5. The high-speed communication element as defined in claim 4, wherein the capacity of said coupling capacitor allows passing of a signal of 60 kHz or higher; and the feedback capacitor of said transistor allows passing of a signal of 20 MHz or lower.

6. The high-speed communication element as defined in claim 5, wherein said transistor is a Schottky transistor.

7. The high-speed communication element as defined in claim 4, wherein said receiving section is a photo-receiving element for receiving infrared rays carrying the sending signal.

8. The high-speed communication element as defined in claim 7, wherein said photo-receiving element is a photo-diode.

9. The high-speed communication element as defined in claim 7 further comprising:

a light-emitting element for emitting said infrared rays; and a driving circuit for driving said light-emitting element, wherein, said driving circuit and broad-band amplifier circuit are integrated into a single chip to form an integrated circuit, said integrated circuit being mounted on a flexible print substrate in the form of a bare chip together with said light-emitting element and photo-receiving element.

10. The high-speed communication element as defined in claim 9 further comprising a metal casing for covering said light-emitting element, photo-receiving element, and integrated circuit, said metal casing having an opening in a position opposing both a light-emitting surface of said light-emitting element and a photo-receiving surface of said photo-receiving element.

11. The high-speed communication element as defined in claim 9, wherein said flexible print substrate includes:

a mounting section on which said light-emitting element, photo-receiving element, and integrated circuit are mounted;

a connector terminal being electrically connected to said integrated circuit; and a linking section for linking said mounting section and connector terminal.

12. The high-speed communication element as defined in claim 11, wherein said linking section is smaller than said mounting section in width.

\* \* \* \* \*